United States Patent [19]

Takagi et al.

[11] Patent Number: 5,230,928
[45] Date of Patent: Jul. 27, 1993

[54] ELECTROLESS PLATING METHOD

[75] Inventors: Kaneyuki Takagi, Tokyo; Masayuki Yago, Omiya; Syuki Yoshikawa, Urawa, all of Japan

[73] Assignee: Sankei Giken Kogyo Kabushiki Kaisha, Tokyo, Japan

[21] Appl. No.: 721,656

[22] PCT Filed: Dec. 20, 1990

[86] PCT No.: PCT/JP90/01662

§ 371 Date: Aug. 21, 1991

§ 102(e) Date: Aug. 21, 1991

[87] PCT Pub. No.: WO91/09985

PCT Pub. Date: Jul. 11, 1991

[30] Foreign Application Priority Data

Dec. 22, 1989 [JP] Japan ................................. 1-334164

[51] Int. Cl.$^5$ ............................................ C23C 26/00
[52] U.S. Cl. .................................. 427/443.1; 427/304; 427/305; 427/306; 427/437
[58] Field of Search ................. 427/437, 443.1, 304, 427/305, 306

[56] References Cited

U.S. PATENT DOCUMENTS

| | | | |
|---|---|---|---|
| 3,471,320 | 10/1969 | Sanbestre | 427/306 |
| 4,148,945 | 4/1979 | Bangs | 427/304 |
| 4,216,246 | 8/1980 | Iwasaki | 427/304 |
| 4,246,320 | 1/1981 | Coll-Palagos | 427/443.1 |
| 4,448,811 | 5/1984 | Doty | 427/304 |

FOREIGN PATENT DOCUMENTS

| | | | |
|---|---|---|---|
| 53-059767 | 5/1978 | Japan . | |
| 3064481 | 3/1991 | Japan | 427/306 |

OTHER PUBLICATIONS

English translation of Japanese Patent 53-59767.

*Primary Examiner*—Michael Lusigan
*Assistant Examiner*—Vi Duong Dang
*Attorney, Agent, or Firm*—Armstrong, Westerman, Hattori, McLeland & Naughton

[57] ABSTRACT

This invention relates to a novel electroless plating method which requires no pre-treatment step for the surface-corrosion on the surface to be plated, wherein a metal layer is formed by applying, onto the surface to be plated, a solution of a composition consisting of a styrene type elastomer used generally as a component for the hot melt type adhesive agent, or the styrene type elastomer and a stickiness imparting resin of a molecular structure similar to that of the elastomer; drying the solution as applied; and effecting the electroless plating on the coated film thus obtained, the method being able to substitute the conventional electroless plating as an advance step of the electrolytic plating for synthetic resin. The particular object of the present invention is to utilize the method in the field of the electroless plating for the purpose of preventing the plating operation from the electromagnetic wave disturbances.

3 Claims, No Drawings

ELECTROLESS PLATING METHOD

FIELD OF TECHNOLOGY

This invention relates to a novel electroless plating method which requires no pre-treatment step for the surface-corrosion on the surface to be plated, wherein a metal layer is formed by applying, onto the surface to be plated, a solution of a composition consisting of a styrene type elastomer used generally as a component for the hot melt type adhesive agent, or the styrene type elastomer and a stickiness imparting resin of a molecular structure similar to that of the elastomer; drying the solution as applied; and effecting the electroless plating on the coated film thus obtained, the method being able to substitute the conventional electroless plating as an advance step of the electrolytic plating for synthetic resin. The particular object of the present invention is to utilize the method in the field of the electroless plating for the purpose of preventing the plating operation from the electromagnetic wave disturbances.

BACKGROUND TECHNOLOGY

The electroless plating is effected as a step for rendering a non-electrically conductive body such as synthetic resin products to become electrically conductive so that it may be subjected to the electrolytic plating, wherein the surface of the non-electrically conductive product to be plated is subjected to a pre-treatment for corroding it by any method to form very fine holes due to corrosion, and, in the electroless plating to be carried out subsequently, the plated layer is bonded to the surface of the base material by the anchoring effect of the metal to be deposited in the inner surface of the holes from the corrosion.

Further, there has been effected, for the printed circuit wiring board, a method, in which the electroless plating is carried out, after a curing type adhesive agent to be more corrosive than the base material is applied on the surface to be plated to corrode the surface.

This method accompanies, at any rate a corrosion step by use of strong chemicals, which corroding step comprises a pre-treatment step and post-treatment a step of defattening, rinsing, neutralizing, rinsing, etc. before and after this corroding step.

Further, as the conventional technique of intercepting the electromagnetic wave, there are various methods such as application of electrically conductive paint, flame coating of zinc, laminating layers of electrically conductive synthetic resin filled with an electrically conductive substance, or forming a sandwich structure with this electrically conductive synthetic resin layer as a core, and others. Of these various methods, the application of the electrically conductive paint has been widely used.

Any of these methods, however, cannot be said to have exhibited satisfactory effect. Even the most widely used electrically conductive paint is very expensive in price, and, in addition, the paint coating is required to be made thick, which would increase the cost for painting work.

In recent years, the electromagnetic wave intercepting effect of the coating formed by the electroless plating has become highly evaluated, but it has still not attained its diffusion owing to its point of problem to be mentioned hereinbelow.

Besides the conventional electroless plating technique comprises long and time-taking process steps, it is required to take anti-pollution measures, because the process utilizes a large quantity of strong corrosive liquid such as chromic acid, sulfuric acid, and so forth, as mentioned in the foregoing. Therefore, this technique has its restriction such that it cannot be put into practice where there is no facility for these measures, and also has an economical problem of bearing the cost for the anti-pollution measures.

When the plating is effected on a synthetic resin, special brands of resins adapted for the plating should be used, which resins are more expensive than ordinary resins. Therefore, no electroless plating is effected on the synthetic resins other than those which can meet the strict requirement for the interceptibility against electromagnetic wave.

In contrast to the conventional method for electroless plating of the synthetic resin, which makes use of the anchoring effect of a metal to be deposited in the inner surface of those corroded holes, the present inventors conceived a method, in which a solution of a hot-melt type adhesive agent is first applied to the surface to be plated, without corroding the same, and then the coating as applied is dried to thereby form a layer of the adhesive agent; after this, the electroless plating is effected on the layer of the adhesive agent; and, subsequently, the plated adhesive layer is heated to melt the adhesive layer, thereby causing the adhesive effect to appear. With this conception, they conducted various studies and experiments, and reached a conclusion that this plating method was feasible, when use is made of an adhesive agent containing therein a high molecular weight compound with the polar group being included in the composition, based on which finding they filed a previous patent application (vide: Japanese Patent Application No. 198207/1989 laid-open Mar. 19, 1991 as number 1-198207).

This method, however, is subjected to restrictions in the heating temperature, material to be plated, plating conditions, and so forth, for the reason that it comprises the final heating step, hence measures should be taken to prevent cracks from occurring due to difference in linear expansion coefficients between the material to be plated and the plated layer, during this heating step.

With a view to solving this problem, the present inventors have further conducted various studies on the compositions of the adhesive agents, in the course of which they discovered totally unexpected phenomenon such that copper is quickly deposited by the electroless plating on the coated film of a composition made up of a combination of styrene/butadiene/styrene block copolymer, not containing therein the polar group at all, and aliphatic/aromatic copolymer hydrocarbon type stickiness imparting resin, whereby a plated layer having favorable outer appearance is obtained, and, moreover, that this plated layer exhibited, according to the cross-cut adhesion test, its adhesive strength of 100/100, in its state as it is, without undergoing heating. From this unique phenomenon, they found out a clue for solving the abovementioned problem, and, as the result of various studies and experiments, they completed the present invention.

DISCLOSURE OF THE INVENTION

That is to say, the present invention is as follows.
1. The electroless plating method characterized by consisting of the following steps of (1) to (5):

(1) adhesive agent coating step, at which a thin layer of adhesive agent for the electroless plating, consisting of the undermentioned composition A, or A and B on the surface to be plated which exhibits adhesiveness to the adhesive agent:

A—styrene type thermoplastic elastomer

B—any one kind of aliphatic diene monomer/aromatic vinyl monomer copolymer type hydrocarbon resin, terpene/aromatic vinyl monomer copolymer type hydrocarbon resin, and ketone resin; or a mixture of two or more kinds of these resins;

(2) defattening and rinsing step, at which the abovementioned product coated with the adhesive agent is immersed into a defattening and rinsing liquid until such time when the adhesive agent coated surface exhibits perfect wetting property to water;

(3) catalyst attaching step, at which the product as defattened and rinsed is immersed in a catalyst solution to thereby attach the catalyst onto the adhesive agent coated surface;

(4) reaction accelerating step, at which the product with the catalyst having been attached thereon is immersed in a solution of a reaction accelerator; and (5) electroless plating step, at which the product as treated with the reaction accelerator is immersed into an electroless plating liquid to form the plated layer on the adhesive agent coated surface.

The abovementioned adhesive agent for the electroless plating should preferably be composed of 100 to 50% by weight of styrene type thermoplastic elastomer, and 0 to 50% by weight of aliphatic/aromatic copolymer hydrocarbon type stickiness imparting resin. Also, the material constituting the surface of the abovementioned article to be plated should preferably be styrene type resin or styrene type resin modified.

BEST MODE TO PRACTICE THE INVENTION

The electroless plating method according to the present invention is different from the conventional electroless plating method, in the point that it has only included, before the conventional electroless plating step, an additional step of forming an adhesive agent layer of a particular composition for the electroless plating, which does not contain therein the polar group, or which contains therein the polar group but does not contain the functional group, this being an important point of the present invention. A metal layer as deposited on this adhesive agent layer by the electroless plating does not exfoliate, even if it is subjected to the cross-cut adhesion test. The reason for this metal layer deposited by the electroless plating on the surface of the resin of a composition which contains neither the functional group nor the polar group at all, or which contains the polar group as in the ketone resin, but does not contain the functional group being adhered to the surface of the resin with such tightness is yet to be clarified.

Further detailed explanations will be given hereinbelow.

The material for the product, onto which the method of the present invention can be directly applied, may be those which exhibit adhesive property with the electroless plating adhesive agents to be used for the method of the present invention, and which do not bring about cracks, even when the material comes into contact with those aromatic type solvents such as toluene, xylene, etc., chlorinated hydrocarbon type solvents, butyl acetate ester, tetrahydrofuran, etc. to be used as the solvent for the method of the present invention.

While use of styrene type resins such as acrylonitrile/butadiene/styrene resin (hereinafter abbreviated as "ABS"), styrene-modified polyphenylene oxide resin (hereinafter abbreviated as "PPO"), styrene type resin containing therein polymer alloy, or others is preferable, there may also be used those thermosetting resins such as polybutylene terephthalate resin (hereinafter abbreviated as "PBT"), Nylon or fiber-reinforced plastic (hereinafter abbreviated as "FRP"), phenolic resin, epoxy resin, and so forth, provided that, depending on the kind of the resin to be used, proper selection of the stickiness imparting resin and the solvent is necessary.

In the case of a material, on which the adhesive agent is difficult to be placed directly, a primer or an undercoating paint is first applied on the surface to be plated to thereby form the surface with sufficient adhesive power, and then the method of the present invention is adopted.

By the styrene type thermoplastic elastomer as the component A of the composition to be the adhesive layer for the electroless plating, it is meant any kind of the block copolymer of styrene/butadiene/styrene (hereinafter abbreviated as "SBS") and the block copolymer of styrene/isoprene/styrene (hereinafter abbreviated as "SIS"), or a mixture of both these block copolymers. The mode of copolymerisation for these copolymers may be either one, in which styrene is block-copolymerised at both terminal ends of the molecules, or one, in which styrene is also block-copolymerized in the middle of the molecular chain, though the latter is preferable. Also, the degree of copolymerisation of styrene should preferably be 30% or more.

By the aliphatic diene monomer of the copolymer component in other component B, it is meant those aliphatic diene compounds such as 1,3-pentadiene, isoprene. Also, aromatic vinyl monomers are meant by those having the substituent group in their $\alpha$-position and/or the aromatic ring, such as $\alpha$-methyl styrene, vinyl toluene, methyl isopropenyl toluene, and so forth as well as those containing therein indene. The ketone resins are designated by those condensated resins of aromatic ketone and formaldehyde, such as cyclohexanone or acetophenone, the structure of which does not contain therein the methylol group, but it is methylene-bonded at the 2 and 6 positions.

The mixing quantity of the abovementioned stickiness imparting resin should preferably be from 0 to 50% by weight. When the quantity exceeds 50% by weight, the adhesive property thereof with the plated layer becomes lowered. While it is possible to obtain the plated layer exhibiting the strong adhesive power with the styrene type thermoplastic elastomer alone which does not contain at all the stickiness imparting resin, the solution has high viscosity, in this case, so that its workability during the coating step and the outer appearance of the plated layer are inferior to the solution, to which the stickiness imparting resin has been added.

As the method for forming the adhesive agent layer of the abovementioned composition in the first step, there may be a method of spraying the solution of the adhesive agent by means of a spray gun, a method of applying the solution by means of a coater, various printing methods, a method by use of a dispenser, and so forth. These methods may be selected depending on the purpose of the plating, the location where the plating is effected, and the shape of the article to be plated.

The rinsing condition in the second step is somewhat more stringent than the ordinary condition, because the adhesive layer is non-polar.

The third to fifth steps are the conventional ones.

Incidentally, while the reason why the metal layer to be deposited by the electroless plating is firmly adhered on the surface of the resin film of a composition which contains neither the functional group nor the polar group is still to be clarified, the molecular structure to be mentioned below is assumed to be something to do with this phenomenon from the findings obtained during the study of the present invention, which is as follows. That is to say, the styrene type elastomer has its molecular structure containing therein the aliphatic chain having the double bond between the aromatic rings, and the molecular structure of the stickiness imparting resin is also very close or similar to the abovementioned molecular structure; further, its adhesion mechanism is considered to be different from the ordinary adhesion mechanism.

In more detail, the plated layer tightly adheres by itself to the styrene type elastomer; combination of the styrene type elastomer and the aliphatic hydrocarbon type stickiness imparting resin, and the combination of the styrene type elastomer and the aromatic hydrocarbon type stickiness imparting resin, was either impossible; and, even if use was made of the aliphatic diene monomer/aromatic vinyl monomer copolymer type hydrocarbon resin, the combination of the styrene type elastomer and the styrene/ethylene/butylene/styrene copolymer resin to be obtained by hydrogenation of SBS was impossible, not to say of the case of the elastomer being the ethylene/vinyl acetate copolymer.

Also, using the test specimens of the modified PPO, the adhesion-peeling tests were conducted for the adhesive agents of various compositions with copper foil. In all cases, the adhesive layers peeled off the surface of the copper foil, and there could be recognized no interrelationship between the peeling strength and adhesive strength of the copper plated coating.

In the following, the present invention will be explained with reference to examples.

Various adhesive agents for the electroless plating of the compositions as shown in Table 1 below were prepared. Using these adhesive agents, the electroless plating tests were conducted in accordance with the method of the present invention. The results of the tests are shown in Table 2 below.

In these Tables, aliphatic diene monomer/aromatic vinyl monomer copolymer type hydrocarbon resin is abbreviated as "aliphatic/aromatic copolymer", and terpene/aromatic vinyl monomer copolymer type hydrocarbon resin is abbreviated as "terpene copolymer".

Process for Preparing Adhesive Specimen

The adhesive agents were dissolved in the order of the symbols B and A as shown in Table below, and the solution was left for 24 hours at a room temperature, followed by agitating the same sufficiently; then it was left for 24 hours or longer at a room temperature, thereby preparing the adhesive specimen.

Process for Electroless Plating

Preparation of the Specimen for the Plating Test

The injection-molded test specimens of the materials to be mentioned later were subjected to the heat treatment for 10 mins. at a temperature of 120° C. (in the case of the ABS resin, for 60 minutes at 85° C.), after which the abovementioned adhesive specimens were applied onto the test specimen by use of a poster-drawing brush, followed by drying the specimen.

Chemical Liquid Used

Defattening agent—a defattening and rinsing agent consisting of sodium boride, sodium phosphate, and surfactant Catalyst liquid—a mixed catalyst of palladium chloride and stannous chloride Reaction accelerator—hydrochloric acid Electroless copper plating liquid—aqueous solution containing therein copper sulfate, formaldehyde and EDTA as the solute component

Plating conditions

Defattening at 50° C. for 5 mins.; rinsing with water; immersion into catalyst liquid at a normal temperature for 5 mins.; immersion into reaction accelerator liquid at a normal temperature for 5 mins.; rinsing with water; immersion into warm water bath (at 50° C.) for 1 min.; immersion into electroless plating liquid at 50° C. for 5 mins.; rinsing with water; and drying.

Evaluation of test results

Observation of the state of deposition; rate of deposition; presence or absence of floats; peeling strength (test with cellophane tape).

The evaluation was done immediately after the plating in the state of the plated layer as deposited; after lapse of 24 hours, the cross-cut adhesion test was carried out.

Material To Be Plated As Used for the Test

Modified PPO resin; ABS resin; PBT resin; Nylon; polypropylene resin; FRP; phenolic resin; and epoxy resin

TABLE 1

| Specimen No. | Adhesive Components | | | Mixing Qty of Each Component (part by weight) | | |
| --- | --- | --- | --- | --- | --- | --- |
| | A Elastomer | B Stickiness Imparting Resin | S Solvent | A | B | S |
| Ex. 1-1 | SBS (1) A Note 1 | Aliphatic/Aromatic Copolymer (1) B Note 1 | Tetrahydrofuran | 25 | — | 75 |
| Ex. 1-2 | SBS (1) A Note 1 | Aliphatic/Aromatic Copolymer (1) B Note 1 | Tetrahydrofuran | 20 | 5 | 75 |
| Ex. 1-3 | SBS (1) A Note 1 | Aliphatic/Aromatic Copolymer (1) B Note 1 | Tetrahydrofuran | 15 | 10 | 75 |
| Ex. 1-4 | SBS (1) A Note 1 | Aliphatic/Aromatic Copolymer (1) | Tetrahydrofuran | 10 | 15 | 75 |

TABLE 1-continued

| Specimen No. | Adhesive Components | | | Mixing Qty of Each Component (part by weight) | | |
|---|---|---|---|---|---|---|
| | A Elastomer | B Stickiness Imparting Resin | S Solvent | A | B | S |
| Ex. 1-5 | SBS (1) A Note 1 | B Note 1 Aliphatic/Aromatic Copolymer (1) | Tetrahydrofuran | 7.5 | 17.5 | 75 |
| Ex. 1-6 | SBS (1) A Note 1 | B Note 1 Aliphatic/Aromatic Copolymer (1) | toluene | 15 | 10 | 75 |
| Ex. 1-7 | SBS (1) A Note 1 | B Note 1 Aliphatic/Aromatic Copolymer (1) | butyl acetate | 15 | 10 | 75 |
| Ex. 2-1 | SBS (1) A Note 1 | B Note 1 Aliphatic/Aromatic Copolymer (2) | butyl acetate | 15 | 10 | 75 |
| Ex. 2-2 | SBS (1) A Note 1 | B Note 2 Aliphatic/Aromatic Copolymer (3) | butyl acetate | 15 | 10 | 75 |
| Ex. 2-3 | SBS (1) A Note 1 | B Note 3 Terpene Copolymer | butyl acetate | 15 | 10 | 75 |
| Ex. 2-4 | SBS (1) A Note 1 | B Note 4 Ketone Resin (1) | butyl acetate | 15 | 10 | 75 |
| Ex. 2-5 | SBS (1) A Note 1 | B Note 5 Ketone Resin (2) | butyl acetate | 15 | 10 | 75 |
| Ex. 3-1 | SBS (1) | B Note 6 Terpene Copolymer | butyl acetate | 12.5 | 12.5 | 75 |
| Ex. 3-2 | SBS (1) | Terpene Copolymer | butyl acetate | 10 | 15 | 75 |
| Ex. 3-3 | SBS (1) | Terpene Copolymer | butyl acetate | 7.5 | 17.5 | 75 |
| Ex. 3-4 | SBS (1) | Ketone Resin (2) | butyl acetate | 12.5 | 12.5 | 75 |
| Ex. 3-5 | SBS (1) | Ketone Resin (2) | butyl acetate | 10 | 15 | 75 |
| Ex. 3-6 | SBS (1) | Ketone Resin (2) | butyl acetate | 7.5 | 17.5 | 75 |
| Ex. 4-1 | SIS A Note 2 | — | butyl acetate | 25 | — | 75 |
| Ex. 4-2 | SBS A Note 3 | — | butyl acetate | 25 | — | 75 |
| Ex. 4-3 | SIS | Aliphatic/Aromatic Copolymer (1) | butyl acetate | 15 | 10 | 75 |
| Ex. 4-4 | SBS (2) | Aliphatic/Aromatic Copolymer (1) | butyl acetate | 15 | 10 | 75 |
| Ex. 4-5 | SIS | Aliphatic/Aromatic Copolymer (2) | butyl acetate | 15 | 10 | 75 |
| Ex. 4-6 | SBS (2) | Aliphatic/Aromatic Copolymer (2) | butyl acetate | 15 | 10 | 75 |
| Ex. 4-7 | SBS (3) A (Note 4) | — | butyl acetate | 25 | — | 75 |
| Ex. 4-8 | SBS (3) A (Note 4) | Aliphatic/Aromatic Copolymer (2) | butyl acetate | 15 | 10 | 75 |
| Ex. 4-9 | SBS (2) | Terpene Type Copolymer | butyl acetate | 15 | 10 | 75 |
| Ex. 5-1 | SBS (1) | Aliphatic/Aromatic Copolymer (1) & Terpene Type Copolymer (former: latter = 2:1) | butyl acetate | 15 | 10 | 75 |
| Ex. 5-2 | SBS (1) | Aliphatic/Aromatic Copolymer (1) & Terpene Type Copolymer (former: latter = 1:2) | butyl acetate | 15 | 10 | 75 |
| Ex. 5-3 | SBS (1) | Aliphatic/Aromatic Copolymer (1) & Ketone Resin (former: latter = 2:1) | butyl acetate | 15 | 10 | 75 |
| Ex. 5-4 | SBS (1) | Aliphatic/Aromatic Copolymer (1) & Ketone Resin (former: latter = 1:2) | butyl acetate | 15 | 10 | 75 |
| Ex. 5-5 | SBS (1) | Ketone Resin & Terpene Copolymer (former: latter = 2:1) | butyl acetate | 15 | 10 | 75 |
| Ex. 5-6 | SBS (1) | Ketone Resin (1) & Terpene Copolymer (former: latter = 2:1) | butyl acetate | 15 | 10 | 75 |
| Ex. 5-7 | SBS (1) | Aliphatic/Aromatic Copolymer (1), Terpene Copolymer & Ketone Resin (1) (ratio of three = 1:1:1) | butyl acetate | 15 | 9 | 76 |
| Comp. 1 | SBS (1) | Aliphatic Type B Note 7 | butyl acetate | 15 | 10 | 75 |
| Comp. 2 | SBS (1) | Aromatic Type B Note 8 | butyl acetate | 15 | 10 | 75 |

TABLE 1-continued

| Specimen No. | Adhesive Components | | | Mixing Qty of Each Component (part by weight) | | |
|---|---|---|---|---|---|---|
| | A Elastomer | B Stickiness Imparting Resin | S Solvent | A | B | S |
| Comp. 3 | SBS (1) | Aromatic Type B Note 9 | butyl acetate | 15 | 10 | 75 |
| Comp. 4 | SBS (1) | Alicyclic Type B Note 10 | butyl acetate | 15 | 10 | 75 |
| Comp. 5 | EVE A Note 5 | Aliphatic/Aromatic Copolymer (1) | butyl acetate | 15 | 10 | 75 |
| Comp. 6 | SEBS A Note 6 | Aliphatic/Aromatic Copolymer (1) | butyl acetate | 15 | 10 | 75 |
| Comp. 7 | EVA | Ketone Resin (1) | butyl acetate | 15 | 10 | 75 |
| Comp. 8 | SEBS | Ketone Resin (1) | butyl acetate | 15 | 10 | 75 |
| Comp. 9 | EVA | Terpene Copolymer | butyl acetate | 15 | 10 | 75 |
| Comp. 10 | SEBS | Terpene Copolymer | butyl acetate | 15 | 10 | 75 |

A Note 1: Styrene/butadiene/styrene block copolymer having the styrene block at other positions than both ends of the molecule (degree of styrene copolymerization being 40%)
A Note 2: Styrene/isoprene/styrene block copolymer
A Note 3: Styrene/butadiene/styrene block copolymer having the styrene block at other positions than both ends of the molecule (degree of styrene copolymerization being 30%)
A Note 4: Styrene/butadiene/styrene block copolymer having the styrene block at both ends of the molecule alone
A Note 5: Ethylene/vinyl acetate copolymer with the content of vinyl acetate being 46% by weight
A Note 6: Hydrogenated product of styrene/butadiene/styrene block copolymer
B Note 1: Copolymer resin of 1,3-pentadiene/indene, etc.
B Note 2: Isoprene/alkyl substituted α-methylstyrene copolymer resin
B Note 3: 1,3-pentadiene/α-methylstyrene copolymer resin
B Note 4: Copolymer resin of terpene and aromatic vinyl monomer
B Note 5: Copolycondensated resin of cyclohexanone and formaldehyde
B Note 6: Copolycondensated resin of acetophenone and formaldehyde
B Note 7: Aliphatic hydrocarbon resin with 1,3-pentadiene as the starting material
B Note 8: Cumarone resin
B Note 9: Terpene resin
B Note 10: Alicyclic saturated hydrocarbon resin

TABLE 2

| | | | | Results of Plating Test | | | |
|---|---|---|---|---|---|---|---|
| | | | | State of Deposition | | Peeling Test | |
| Ex. No. | Particulars | Material to be Plated | Adhesive Specimen No. | Rate of deposition | Peeling during plating | Right after plating | 24 hrs. after plating |
| 1 | Examples, in which mixing qty of stickiness imparting resin has been changed | Modified PPO | Ex. 1-1 | quick | none | no peeling | 100 100 |
| | | | Ex. 1-2 | quick | none | no peeling | 100 100 |
| | | | Ex. 1-3 | quick | none | no peeling | 100 100 |
| | | | Ex. 1-4 | quick | none | partly peeled | 100 100 |
| | | | Ex. 1-5 | quick | none | partly peeled | 88 100 |
| | | | Ex. 1-6 | quick | none | no peeling | 100 100 |
| | | | Ex. 1-7 | quick | none | no peeling | 100 100 |
| 2 | Examples of use of various stickiness imparting resin | Modified PPO | Ex. 2-1 | quick | none | no peeling | 100 100 |
| | | | Ex. 2-2 | quick | none | no peeling | 100 100 |
| | | | Ex. 2-3 | quick | none | no peeling | 100 100 |
| | | | Ex. 2-4 | quick | none | no peeling | 100 100 |
| | | | Ex. 2-5 | quick | none | no peeling | 100 100 |
| | | | Comp. 1 | quick | peeled | — | — |
| | | | Comp. 2 | quick | peeled | — | — |
| | | | Comp. 3 | quick | no peeling | partly peeled | — |
| | | | Comp. 4 | quick | no peeling | partly peeled | — |
| 3 | Examples, in which mixing ratio has been changed at the time of using keton resin and terpene copolymer | Modified PPO | Ex. 3-1 | quick | no peeling | no peeling | 100 100 |
| | | | Ex. 3-2 | quick | no peeling | partly peeled | 100 100 |
| | | | Ex. 3-3 | quick | no peeling | peeled | — |
| | | | Ex. 3-4 | quick | no peeling | no peeling | 100 100 |
| | | | Ex. 3-5 | quick | no peeling | no peeling | 100 100 |
| | | | Ex. 3-6 | quick | no peeling | no peeling | 100 100 |
| 4 | Examples of various | Modified PPO | Ex. 4-1 | quick | none | no peeling | 100 |

TABLE 2-continued

| Ex. No. | Particulars | Material to be Plated | Adhesive Specimen No. | Rate of deposition | Peeling during plating | Right after plating | 24 hrs. after plating |
|---|---|---|---|---|---|---|---|
| | combinations of elastomers and stickiness imparting resins | | Ex. 4-2 | quick | none | no peeling | 100 100 100 |
| | | | Ex. 4-3 | quick | none | no peeling | 100 100 |
| | | | Ex. 4-4 | quick | none | no peeling | 100 100 |
| | | | Ex. 4-5 | quick | none | no peeling | 100 100 |
| | | | Ex. 4-6 | quick | none | no peeling | 100 100 |
| | | | Ex. 4-7 | quick | none | no peeling | 100 100 |
| | | | Ex. 4-8 | quick | none | no peeling | 100 100 |
| | | | Ex. 4-9 | quick | none | no peeling | 100 100 |
| | | | Comp. 5 | quick | peeled | — | — |
| | | | Comp. 6 | quick | peeled | — | — |
| | | | Comp. 7 | very slow | none | — | — |
| | | | Comp. 8 | quick | peeled | — | — |
| | | | Comp. 9 | quick | peeled | — | — |
| | | | Comp. 10 | quick | peeled | — | — |
| 5 | Examples of use of various stickiness imparting resins in mixture | ABS | Ex. 5-1 | quick | none | no peeling | 100 100 |
| | | Modified PPO | Ex. 5-2 | quick | none | no peeling | 100 100 |
| | | | Ex. 5-3 | quick | none | no peeling | 100 100 |
| | | | Ex. 5-4 | quick | none | no peeling | 100 100 |
| | | ABS | Ex. 5-5 | quick | none | no peeling | 100 100 |
| | | | Ex. 5-6 | quick | none | no peeling | 100 100 |
| | | Modified PPO | Ex. 5-7 | quick | none | no peeling | 100 100 |
| 6 | Examples of various materials to be plated | ABS Note 2 | Ex. 5-4 | quick | none | no peeling | 100 100 |
| | | PBT Note 3 | Ex. 2-4 | quick | none | no peeling | 100 100 |
| | | Nylon 66 Note 4 | Ex. 1-7 | quick | none | no peeling | 100 100 |
| | | Polypropylene Note 5 | Ex. 2-4 | slightly slow | none | no peeling | 100 100 |
| | | FRP Note 6 | Ex. 2-3 | quick | none | no peeling | 100 100 |
| | | Phenolic resin Note 7 | Ex. 1-7 | quick | none | no peeling | 100 100 |
| | | Epoxy resin None 8 | Ex. 2-3 | quick | none | no peeling 100 | 100 |

Note 1: "general purpose" grade
Note 2: "flame resisting" grade
Note 3: "non-combustible" grade
Note 4: "general purpose" grade
Note 5: primer applied piece for polypropylene
Note 6: sheet forming purpose
Note 7: resin-impregnated paper
Note 8: resin-impregnated glass mat

INDUSTRIAL SUSCEPTIBILITY

Since the method according to the present invention does not require the corrosion treatment to be effected on the plating surface, the electroless plating can be done easily at any location of a product. Moreover, this method is such one that is suitable for electroless-plating of the styrene type resin such as ABS resin, the styrene-modified PPO type resin, the materials of which are used most generally in the electronic apparatuses and appliances.

Accordingly, it is anticipated that the resin products tend to be employed for the electromagnetic wave shielding with high density packaging of those electronic apparatuses and appliances, increasing demand for them, and augmented production; hence easy plating of such products at any location on them makes it easy to cope with the trend in these electronic apparatuses and appliances, the industrial merit of which is great.

We claim:

1. Electroless plating method consisting of the following steps (1) to (5):
    (1) adhesive agent coating step by formation of a thin layer of an adhesive agent for the electroless plating to obtain agent coated product consisting of the below-listed composition A, or A and B, on the surface of the product to be plated which exhibits adhesiveness to said adhesive agent:

A is styrene thermoplastic elastomer

B is at least one member selected from the group consisting of aliphatic diene monomer/aromatic vinyl monomer copolymer hydrocarbon resin, terpene/aromatic vinyl monomer copolymer hydrocarbon resin, and ketone resin;

(2) defattening and rinsing step by immersion of said adhesive agent coated product into a defattening and rinsing liquid until said adhesive agent coated surface exhibits wetting property to water;

(3) catalyst attaching step by immersion of said defattened and rinsed product into a solution of the catalyst to thereby attach a catalyst on the adhesive agent coated surface;

(4) reaction accelerating step by immersion of said catalyst attached product into a solution of a reaction accelerating agent; and (5) electroless plating step by immersion of said product as treated with the reaction accelerating agent into the electroless plating liquid to thereby form a plated layer on the adhesive agent coated surface.

2. Electroless plating method as set forth in claim 1, characterized in that said adhesive agent for the electroless plating consists of 100 to 50% by weight of styrene thermoplastic elastomer and 0 to 50% by weight of aliphatic diene monomer/aromatic vinyl monomer copolymer hydrocarbon resin.

3. Electroless plating method as set forth in claim 1, characterized in that the material constituting the surface of said product to be plated is a styrene resin or styrene resin modified.

* * * * *